Oct. 27, 1970 M. GARFINKEL ET AL 3,535,775

FORMATION OF SMALL SEMCONDUCTOR STRUCTURES

Filed Dec. 18, 1967

Inventors:
Marvin Garfinkel;
William E. Engeler,
by Marvin Snyder
His Attorney.

United States Patent Office 3,535,775

Patented Oct. 27, 1970

3,535,775

FORMATION OF SMALL SEMICONDUCTOR STRUCTURES

Marvin Garfinkel, Schenectady, and William E. Engeler, Scotia, N.Y., assignors to General Electric Company, a corporation of New York Filed Dec. 18, 1967, Ser. No. 691,484

Int. Cl. H01l 7/54

U.S. Cl. 29—584 14 Claims

ABSTRACT OF THE DISCLOSURE

Fabrication of extremely small semiconductor devices is achieved by irradiating with fission fragments a semiconductor wafer substrate, such as silicon, coated with a layer of an insulator, such as silicon dioxide, applying a protective photoresist layer over predetermined regions of the silicon dioxide, and thereafter etching narrow diameter holes in the silicon dioxide through to the substrate in the unprotected regions along the path of the fission fragments. Metal contacts may then be evaporated into the holes to form Schottky diodes, or additional silicon may be grown epitaxially through the holes. Additionally, conductivity type determining impurities may be diffused into the substrate through the holes in the silicon dioxide layer. Contact to the resulting devices is then made by metallizing the wafer in the predetermined regions.

BACKGROUND OF THE INVENTION

This invention relates to fabrication of extremely small semiconductor devices, and more particularly to a method of making small area electrical contact to a silicon wafer through narrow diameter holes formed in an insulating layer on the wafer.

Photoengraving techniques have been used to great advantage in the semiconductor industry to fabricate a wide variety of electronic devices. These techniques are generally used, for example, to etch a pattern in a silicon dioxide layer covering a silicon wafer in order to define regions for diffusion, to produce electrical contacts, or to established electrical isolation. However, photoengraving techniques have an inherent size limitation due to the finite wavelength of light. In principle, the smallest sizes which may be produced through use of photoengraving techniques are in the order of the wavelength of light, typically 5,000 angstroms. Nevertheless, the best resolution which has heretofore been attained is in the order of 10,000 angstroms. The present invention is concerned with a method of producing exceedingly small semiconductor devices which have dimensions considerably smaller than those which have heretofore been attainable.

BRIEF SUMMARY OF THE INVENTION

Briefly, in accordance with a preferred embodiment of the invention, a method of making small area electrical contact to a semiconductor wafer is provided. This method comprises forming a layer of insulating material on a surface of the wafer, and thereafter exposing the insulator covered surface of the wafer to heavy particle nuclear irradiation so as to form damage tracks therein. Predetermined regions of the irradiated wafer are then etched to form narrow diameter holes along the damage tracks therein completely through the insulating layer to the surface of the semiconductor. Etching proceeds more rapidly along the paths traversed by the fission fragments than elsewhere. Contact with the wafer may then be made by depositing metal onto the wafer through the narrow diameter holes in the insulating layer, or by epitaxially growing additional semiconductor through the holes. Additionally, impurities may be diffused into the wafer through the holes. If desired, the unetched damage tracks in the other regions may be repaired by annealing the wafer at moderate temperatures. Devices formed in this manner are comparable in size to the holes.

Accordingly, one object of the invention is to provide a method for contacting a semiconductor wafer through narrow diameter holes etched through an insulating layer formed on a semiconductor wafer.

Another object is to provide a method for producing semiconductor devices of smaller size than has previously been deemed possible.

Another object is to provide a method for making electrical contact to semiconductor devices of extremely small size.

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DESCRIPTION OF TYPICAL EMBODIMENTS

Figure 1:
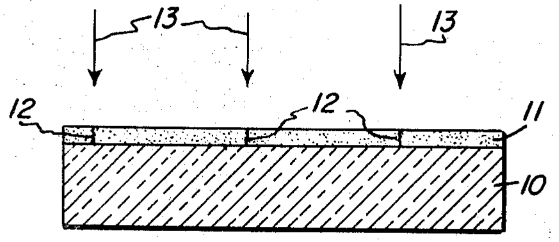
FIG. 1 illustrates a semiconductor wafer coated with an insulating layer and undergoing heavy nuclear particle irradiation.

In FIG. 1, a substrate comprising a wafer 10 of semiconductor material, such as silicon of a predetermined conductivity type for example, is shown coated with an insulating layer 11, preferably comprised of silicon dioxide. Silicon dioxide layer 11 may be formed by oxidizing the wafer as a result of heating the wafer to a temperature of 1100° C. in an oxygen atmosphere, and is typically in the order of 3200 angstroms in thickness. Alternatively, insulating layer 11 may be formed by depositing silicon dioxide directly upon the wafer.

The silicon dioxide film which has thus been applied to wafer 10 is next exposed to heavy nuclear particle irradiation, as indicated by arrows 13. The heavy nuclear particles may comprise fission fragments, each of which produces a radiation damage track 12 through the silicon dioxide layer. A convenient source of irradiation comprises californium. Duration of exposure may be several hours, so as to be sufficient to produce a predetermined density of damage tracks selected to produce an optimum device yield, as described infra. By use of a sufficiently wide area source and by placement of the source at a sufficient distance from the article to be irradiated, the resulting damage tracks are directed substantially parallel to each other and, by proper orientation of the wafer are directed substantially normal to the plane of the wafer.

Figure 2:
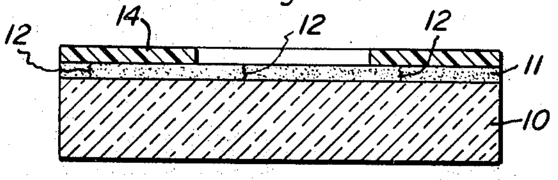
FIG. 2 illustrates the semiconductor wafer of FIG. 1 with an etch mask coated over the insulating layer.

An etch mask 14, shown in FIG. 2, may next be deposited atop silicon dioxide layer 11 so as to delineate a pattern on wafer 10 which is to be etched. This mask is preferably comprised of a photoresist material such as that designated KPR and sold by Eastman Kodak Company, Rochester, N.Y. Techniques for deposition of the photoresist are described in Photosensitive Resists for Industry, published by Eastman Kodak Company (1962). Alternatively, the etch mask may comprise a layer of molybdenum which may be patterned in a similar manner, as described in J. J. Tiemann et al. application Ser. No. 606,242, filed Dec. 30, 1966 and assigned to the instant assignee. Either type of etch mask may be formed prior to irradiating the wafer.

Figure 3:
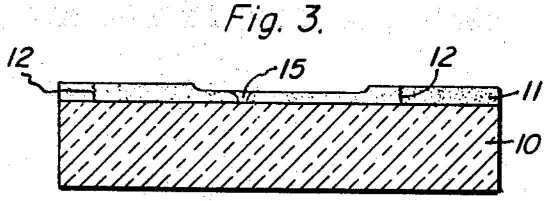
FIG. 3 illustrates the semiconductor wafer of FIGS. 1 and 2 after the insulating layer has undergone etching.

Etching of the silicone dioxide unprotected by the photoresist mask is then performed with buffered hydrofluoric acid comprised of one part concentrated (48%) hydrofluoric acid and ten parts of 40% by weight of ammonium fluoride in water, until the damage tracks produced by the fission fragments have been etched completely through the silicon dioxide down to the silicon, as shown in FIG. 3, leaving a small hole 15 therein. The ratio of the rate at which the buffered hydrofluoric acid etches the damaged portions of the silicon dioxide to the rate at which it etches the undamaged portions is approximately 1.5 to 1, for dry, thermally grown silicon dioxide, since the etch rate of the damaged portions is approximately 1200 angstroms per minute while the etch rate of the undamaged portion is 800 angstroms per minute. After the hole has been etched through to the surface of the silicon, it may be widened by allowing additional etching time, which permits the etchant to act on the silicon dioxide in a lateral direction. Holes as large as 10,000 angstroms in diameter (measured at the silicon-silicon dioxide interface) may be formed conveniently in this manner; for example, an 800 angstrom diameter hole (as measured at the silicon-silicon dioxide interface) may be developed by etching a silicon dioxide layer of 3200 angstroms thickness down to a thickness of about 900 angstroms in the undamaged portion of the oxide layer, requiring approximately 3.2 minutes of etching. Upon completing the etching, the photoresist material is removed in conventional fashion as described in the aforementioned Eastman Kodak Company publication, and the unetched damage in the regions formerly protected from etching by the photoresist material may be repaired, if desired, by annealing the wafer at moderate (600° C. to 800° C.) temperatures for about one hour.

Figure 4:
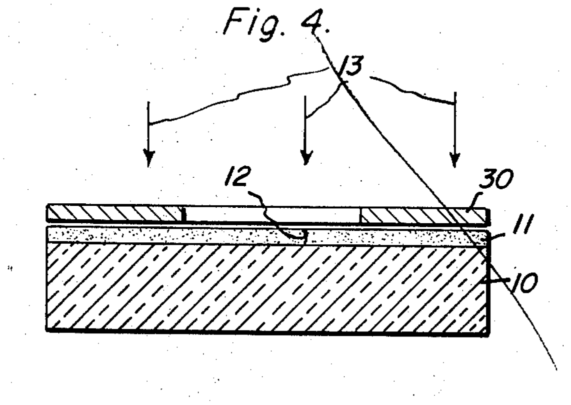
FIG. 4 illustrates a semiconductive wafer coated with an insulating layer and an irradiation shield, undergoing heavy nuclear particle irradiation.
Figure 5:
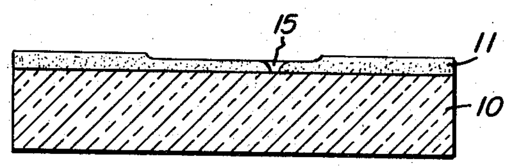
FIG. 5 illustrates the semiconductor wafer of FIG. 4 after the insulating layer has undergone etching.

An alternative method of obtaining etched holes within a predetermined area comprises, as shown in FIG. 4, placing a thin metallic irradiation shield 30, such as nickel, having apertures coincidental with the apertures in the etch mask, over silicon dioxide layer 11 prior to irradiating the wafer. The wafer is then irradiated to produce damage tracks 12 only in the unshielded regions of silicon dioxide layer 11. In order to prevent irradiation due to fission fragments of californium, a half mil thickness of metallic film is sufficient. The damage tracks are then etched with the buffered hydrofluoric acid solution, resulting in a hole 15 through layer 11 for each etched damaged track. In this instance, the annealing step may be omitted, since there are no damaged regions produced in the unetched portion of the insulating or passivating layer, as shown in FIG. 5.

Figure 6A:
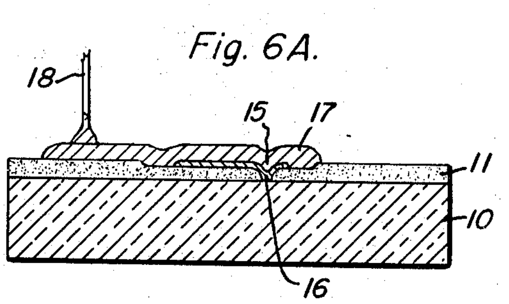
FIGS. 6A–6C illustrate devices wherein contact is made to the semiconductor wafer through the small holes etched in the insulating layer.

After hole 15 has been formed in silicon dioxide layer 11, a diode of the type commonly referred to as a Schottky diode, as illustrated in FIG. 6A, may be formed by sputtering a metal 16, such as chromium, molybdenum or tungsten, over the etched area of insulator layer 11 so as to metallize the area of wafer 10 exposed to view through hole 15. In this instance, silicon wafer 10 is of N-type conductivity and formation of a distinct metal-semiconductor interface known as a Schottky barrier results. The area of the interface is defined by the area of the small hole 15. Thereafter, contact may be made to metal region 16 by evaporating, electroplating or sputtering a metal 17 such as aluminum, for example, over the surface of layer 11 and metallized region 16 and making contact to metal 17 with a lead 18, as by thermocompression bonding. In fabricating integrated circuits, lead 18 may be omitted and metal 17 may be extended over the surface of insulator 11 to make electrical contact to other devices of the circuit.

Figure 6B:
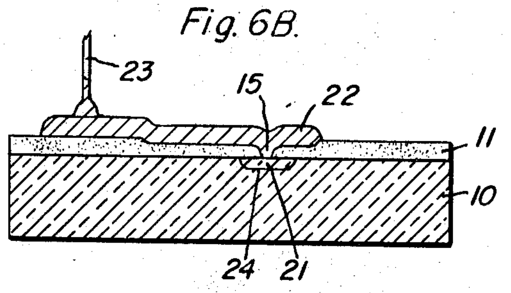

In the alternative, a diffused P-N junction, such as illustrated in FIG. 6B, may be formed in a diffusion system by diffusing impurities through small hole 15 in layer 11 into the silicon of wafer 10 to form a diffused region 21. In this instance, wafer 10 is of N-type conductivity, and the impurities diffused into the wafer through small hole 15 are of the type and in sufficient concentration to produce an opposite conductivity type diffused region 21 and a P-N junction 24. For example, an acceptor impurity such as boron may be diffused, as from a gaseous atmosphere, with the wafer at a temperature of 1000° C. and a flow of gas passing continuously over the wafer. The flow comprises, for example, 1900 cc. per minute of $N_2$, 1800 cc. per minute of a mixture of 0.25 volume percent of $BCl_3$, in nitrogen, one cc. per minute of oxygen and 0.5 cc. per minute $H_2$. During this process, boron diffuses into the surface of P-N junction 24. A light etch in buffered hydrofluoric acid for 10 seconds, for example, removes any boron glass which may be formed on insulating layer 11 in the course of the diffusion. Similarly, a P-N junction can be formed if wafer 10 is of P-type conductivity, since a donor impurity such as phosphorus may be diffused into wafer 10 by heating the wafer to a temperature of approximately 1000° C. in a tube with a flow of 30 cc. per minute of oxygen, 2000 cc. per minute of nitrogen, and 50 cc. per minute of phosphorus trichloride in nitrogen having a concentration of 1900 parts per million. Any glass that may be formed in the course of this diffusion may be removed by etching the wafer in buffered hydrofluoric acid for about 10 seconds. In either case, contact to diffused region 21 may then be made by evaporating a metal 22 such as aluminum over the etched surface area of layer 11 through hole 15 and making contact to metal 22 with a lead 23 or by extending metallized region 22 as described in conjunction with FIG. 6A.

Figure 6C:
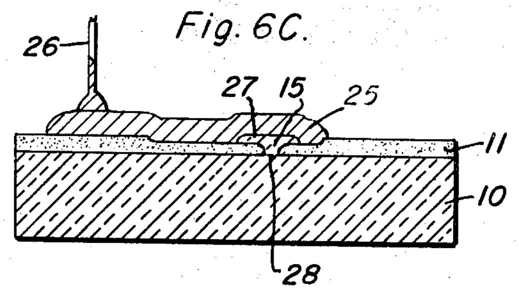

In still another alternative, illustrated in FIG. 6C, a region of silicon 27 may be grown epitaxially upon wafer 10 through small hole 15. This epitaxial growth may be accomplished, for example, in an epitaxial reactor vessel in the manner shown and described in W. C. Dash et. al. Pat. No. 3,316,130, issued Apr. 25, 1967, and assigned to the instant assignee. In order to avoid impeding the flow of transport vapors through hole 15 during the epitaxial growth process, the thickness of insulating layer 11 in the vicinity of the hole is conveniently no more than a few microns for a hole diameter of less than 10,000 angstroms. The epitaxial growth process may be used to produce a P-N junction such as at the original surface 28 of wafer 10 by growing a region of conductivity type semiconductor opposite to that of wafer 10. Contact may then be made to epitaxially grown region 27 by evaporating a metal 25 such as aluminum over the surface of epitaxially grown region 27 and the etched area of layer 11 and making contact to metal 25 with a lead 26, as by thermocompression bonding, or by extending metal pad 25 as described in conjunction with FIG. 6A.

The number of fission fragments traversing each specified area is determined by the duration of exposure and by the intensity of the irradiation source, which is the number of fragments emitted per unit time, and is randomly distributed. Thus, in a given aperture, such as that in mask 14 shown in FIG. 2, a number of fission fragments such as 0, 1, 2, etc. will impinge on insulator 11. This causes devices having 0, 1, 2, etc. active areas to be formed, one active area corresponding to each etched hole. In the embodiments of FIGS. 6A–6C, the devices formed are contacted by metallizing the entire aperture area. This automatically interconnects in parallel all active regions formed within that area independent of their specific locations therein and the number of active regions. For convenience, the description has been directed to devices having only a single active area; however, devices having a plurality of active regions may be formed in this manner. Any desired distribution of active regions per device may be obtained by suitably adjusting the radiation dose. For example, if it is desired to achieve a maximum number of devices having only a single active region, the radiation dose is adjusted so that there exists an overall 30% probability that a particle traverses any of the apertures. It can also be shown that at this dose, there exists about a 17% probability that one and only one particle traverses any given aperture. For a higher yield of devices having a specified number of active regions greater than 1, the dosage is suitably increased.

Each of the embodiments illustrated in FIGS. 6A–6C comprises an extremely small semiconductor device. These devices include much smaller active regions than any which have hitherto been fabricated, since the sizes of the active regions are not inherently limited by the finite wavelength of light. It should also be noted that although the semiconductor specifically described herein comprises silicon, the process is equally applicable to other semiconductor materials. In such instance, the insulator film may be formed by deposition rather than by oxidation.

The foregoing describes a method for contacting a semiconductor wafer through extremely narrow diameter holes etched through an insulating layer formed on a semiconductor wafer. The method may be used for producing semiconductor devices of smaller size than has previously been deemed possible. The method is also useful for making electrical contact to semiconductor devices of extremely small size.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

We claim:

1. A method of making small area electrical contact to a semiconductor wafer, said method comprising: forming a layer of electrical insulation on said wafer; exposing the insulation layer on said wafer to heavy particle nuclear irradiation to form damage tracks in said layer; etching said insulation layer to form narrow diameter holes completely through said layer to said wafter along said damage tracks; and electrically contacting said wafer through said narrow diameter holes.

2. The method of making small area electrical contact to the semiconductor wafer of claim 1 including the step of masking said wafer with an irradiation shield pattern prior to the step of exposing the insulation layer to said heavy particle nuclear irradiation.

3. The method of making small area contact to the semiconductor wafer of claim 1 including the step of masking said wafer with a photoresist material in a predetermined pattern prior to etching the irradiated regions so that only those regions unprotected by said photoresist material will be etched.

4. The method of making small area contact to the semiconductor wafer of claim 3 including the additional step of annealing the wafer to repair damage in the unetched irradiated regions of the wafer after the unmasked irradiated regions have been etched.

5. The method of making small area contact to the semiconductor wafer of claim 1 wherein said semiconductor comprises silicon and the step of forming a layer of electrical insulation on the wafer comprises oxidizing the wafer to form a layer of silicon dioxide thereon.

6. A method of fabricating small diodes of the Schottky barrier type on a semiconductor wafer, said method comprising: forming a layer of electrical insulation on at least one surface of said wafer; exposing the insulation layer to heavy particle nuclear irradiation to form damage tracks in said layer; etching said insulation layer to form narrow diameter holes through said layer to said wafer along said damage tracks; and depositing metal contacts onto said semiconductor wafer through said holes in said insulation layer to form diodes of the Schottky barrier type.

7. The method of fabricating small diodes of the Schottky barrier type on the semiconductor wafer of claim 6 wherein said step of depositing metal contacts onto said semiconductor wafer through said holes in said insulation layer comprises sputtering said metal onto the semiconductor wafer.

8. The method of fabricating small diodes of the Schottky barrier type on the semiconductor wafer of claim 6 wherein said semiconductor comprises silicon and the step of forming a layer of insulation on the wafer comprises oxidizing the wafer to form a layer of silicon dioxide thereon.

9. A method of fabricating small area semiconductor devices in a wafer of semiconductor material, said method comprising: forming a layer of electrical insulation on said wafer; exposing the insulation layer to heavy particle nuclear irradiation to form damage tracks in said layer; etching said insulation layer to form narrow diameter holes through said layer to said wafer along said damage tracks; epitaxially growing additional semiconductor material onto said semiconductor wafer through said holes in said insulation layer; and making electrical contact to said additional semiconductor material.

10. The method of fabricating small area semiconductor devices of claim 9 wherein said semiconductor material comprises silicon and said step of forming a layer of electrical insulation on said wafer comprises oxidizing said wafer to form a layer of silicon dioxide thereon.

11. A method of fabricating small area P-N junctions in wafer of semiconductor material of one conductivity type, said method comprising: forming a layer of electrical insulation on said wafer; exposing the insulation layer to heavy particle nuclear irradiation to form damage tracks in said layer; etching said insulation layer to form narrow diameter holes through said layer to said wafer along said damage tracks; and epitaxially growing semiconductor material of opposite conductivity-type onto said semiconductor wafer through said holes in said insulation layer to form P-N junctions.

12. The method of fabricating small area semiconductor devices of claim 11 wherein said semiconductor material comprises silicon and said step of forming a layer of electrical insulation on said wafer comprises oxidizing said wafer to form a layer of silicon dioxide thereon.

13. A method of fabricating small area P-N junctions in a wafer of semiconductor material of one conductivity type, said method comprising: forming a layer of electrical insulation on said wafer; exposing the insulation layer to heavy particle nuclear irradiation to form damage tracks in said layer; etching said insulation layer to form narrow diameter holes through said layer to said wafer along said damage tracks; and diffusing impurities into said wafter through said holes in said insulation layer to form P-N junctions in said wafer, said impurities being of the type to render said semiconductor material of conductivity type opposite to said one conductivity type.

14. The method of fabricating small area P-N junctions of claim 13 wherein said semiconductor material comprises silicon and said step of forming a layer of electrical insulation on said wafer comprises oxidizing said wafer to form a layer of silicon dioxide thereon.

References Cited

UNITED STATES PATENTS

| | | |
|---|---|---|
| 2,588,254 | 3/1952 | Lark-Horovitz et al. |
| 2,787,564 | 4/1957 | Shockley. |
| 2,817,613 | 12/1957 | Mueller. |
| 3,303,085 | 2/1967 | Price et al. |

PAUL M. COHEN, Primary Examiner

U.S. Cl. X.R.

156—17; 29—578, 577, 589